United States Patent [19]

Lemkey

[11] 4,111,723

[45] * Sep. 5, 1978

[54] DIRECTIONALLY SOLIDIFIED EUTECTIC SUPERALLOY ARTICLES

[75] Inventor: Franklin David Lemkey, Glastonbury, Conn.

[73] Assignee: United Technologies Corporation, Hartford, Conn.

[*] Notice: The portion of the term of this patent subsequent to Mar. 15, 1994, has been disclaimed.

[21] Appl. No.: 650,474

[22] Filed: Jan. 19, 1976

[51] Int. Cl.² ............................................. C22C 19/03
[52] U.S. Cl. ........................................ 148/32; 75/170; 75/171; 148/32.5
[58] Field of Search .................... 75/170, 171; 148/32, 148/32.5

[56] References Cited

U.S. PATENT DOCUMENTS

| | | | |
|---|---|---|---|
| 2,542,962 | 2/1951 | Kinsey | 75/170 |
| 3,904,403 | 9/1975 | Komatsu et al. | 75/170 |
| 4,012,241 | 3/1977 | Lemkey | 75/170 |

Primary Examiner—R. Dean
Attorney, Agent, or Firm—Charles E. Sohl

[57] ABSTRACT

This disclosure relates to an alloy in the nickel-aluminum-molybdenum system of approximately eutectic composition, and articles made by directional solidification of the alloy. The alloy is preferably directionally solidified to produce an article which has a microstructure consisting of a ductile matrix containing ductile reinforcing fibers. The matrix comprises a continuous microstructure of the gamma nickel solid solution phase, and also preferably contains the gamma prime ($Ni_3Al$) intermetallic phase in either precipitate or continuous form. The ductile continuous reinforcing phase consists of alpha molybdenum in fibrous form. The nominal composition of the alloy is 4.6 weight percent aluminum, 35.8 weight percent molybdenum, balance essentially nickel.

7 Claims, 6 Drawing Figures

ISOTHERMAL SECTION (1200°C) OF THE Ni-Al-Mo PHASE DIAGRAM

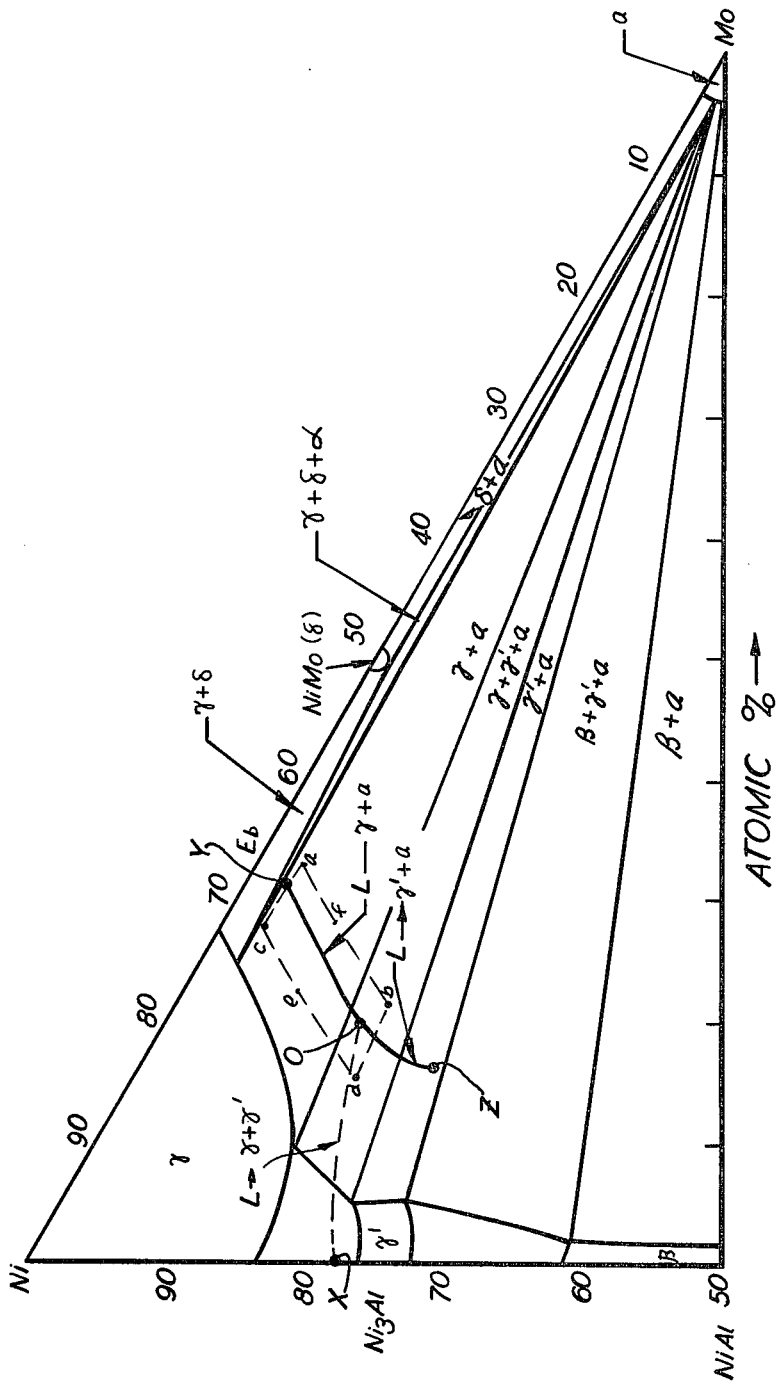

0 w/o Cr  5μm 2 w/o Cr  5μm 4 w/o Cr  5μm 6 w/o Cr  5μm

DIRECTIONALLY SOLIDIFIED EUTECTIC SUPERALLOY ARTICLES

BACKGROUND OF THE INVENTION

1. Field of the Invention

This invention relates to the field of nickel base superalloys used in high temperature applications where high mechanical stresses must be endured. This invention is also related to the field of directionally solidified eutectics wherein an alloy of approximately eutectic composition may be directionally solidified so as to produce an aligned microstructure having anisotropic mechanical properties.

2. Description of the Prior Art

It is now known that certain eutectic alloys respond to proper directional solidification conditions to produce useful second phase aligned microstructures as described in the patent to Kraft, U.S. Pat. No. 3,124,452. In a patent to Thompson, U.S. Pat. No. 3,554,817 there is described a promising pseudo binary eutectic alloy occurring between the inter-metallic compounds $Ni_3Al$ and $Ni_3Cb$ which responds to plane front solidification to produce a casting characterized by an aligned lamellar microstructure. As so cast this combination provides one of the strongest nickel base alloys known although its ductility is less than that of most nickel base superalloys. As is the case with most nickel base alloys, however, improvements in oxidation and sulfidation resistance are desired to permit maximum utilization of the strength characteristics of the alloy at very high temperatures, i.e. > 1000° C. And even though in its usual application a given alloy may be provided with surface protection for increased oxidation erosion resistance, improvements in corrosion resistance in the underlying substrate are nevertheless desirable.

In a prior patent to Thompson and Lemkey, U.S. Pat. No. 3,564,940 there is described a class of compositions which solidify according to the monovariant eutectic reaction providing aligned polyphase structures including such systems as the ternary alloys identified as cobalt-chromium-carbon and nickel-aluminum-chromium. The advantage of compositions of this nature is that the desired microstructure can be achieved over a range of compositions in a given system. This provides a substantial increase in the freedom of selection of compositions permitting increased optimization of properties. In U.S. Pat. No. 3,671,223 the concept has been further developed to include those systems which solidify according to the multivariant eutectic reaction where two or more solid phases (N) crystalize simultaneously from the liquid consisting of (N+2) or more components.

U.S. Pat. No. 3,617,397 to Maxwell, assigned to the present assignee discloses a nickel base superalloy which contains 8 percent aluminum and 18 percent molybdenum. This alloy is far from the eutectic point and the patent does not disclose the benefits available in the directionally solidified eutectic.

U.S. Pat. No. 3,793,010 to Lemkey and Thompson discloses a eutectic article which consists of a gamma-gamma prime matrix with an aligned delta second phase.

U.S. Pat. No. 2,542,962, to Kinsey, discloses a nickel-aluminum-molybdenum alloy with broad ranges which encompass those of the present invention. The Kinsey patent does not disclose the eutectic reactions within the system and does not discuss the possibility of directional solidification. U.S. Pat. No. 3,904,403 to Komatsu discloses a nickel-aluminum-molybdenum alloy with ranges outside those contemplated by the present invention, the microstructure obtained within the Komatsu patent ranges would not include alpha molybdenum.

The most accurate previous work on the nickel-aluminum-molybdenum alloys is described in "The Form of the Equilibrium Diagrams of Ni-NiAl-Mo Alloys" *Academy of Sciences USSR*, 132, May-June 1960, pp 491–495, however this reference does not discuss the eutectic reactions in question.

SUMMARY OF THE INVENTION

The present invention includes a nickel base superalloy of substantially gamma-alpha eutectic composition with a nominal composition of 4.6% aluminum, 35.8% molybdenum, balance essentially nickel and a directionally solidified article made thereof. The discovery of this particular monovariant eutectic composition as a novel composition of matter, is also a part of the invention. This alloy may be cast and directionally solidified so as to produce a microstructure having a continuous gamma (F.C.C.) (nickel solid solution) matrix and an alpha (B.C.C.) (molybdenum solid solution) second phase in fibrous form. The matrix also preferably contains a significant amount of the gamma prime ($Ni_3Al$) phase in precipitate form. Other elements in specific amounts may be incorporated into the alloy so long as additional phases are not formed from the melt. A directionally solidified article of nominal composition will contain approximately 20 volume percent of the alpha (Mo) phase.

The directionally solidified alloy and article are characterized by extremely high ductility at intermediate temperatures (i.e. 1400°–1500° F.) on the order of 15 percent. Directionally solidified eutectics heretofore known in the art have been characterized by low ductilities, and particularly low transverse ductilities. The directionally solidified alloy and article of the present invention have longitudinal and transverse ductilities which excede those of conventional nickel superalloys.

In the following description of the preferred embodiments, the term fibrous will be used to mean both rod like and plate like morphologies. All compositions are in weight percent unless otherwise specified.

The foregoing, and other objects, features and advantages of the present invention will become more apparent in the light of the following detailed description of the preferred embodiment thereof as shown in the accompanying drawing.

BRIEF DESCRIPTION OF THE DRAWING

FIG. 1 shows a portion of the 1200° C. isothermal Ni-Al-Mo phase diagrams with superimposed eutectics indicated.

DESCRIPTION OF THE PREFERRED EMBODIMENT

Figure 2A:
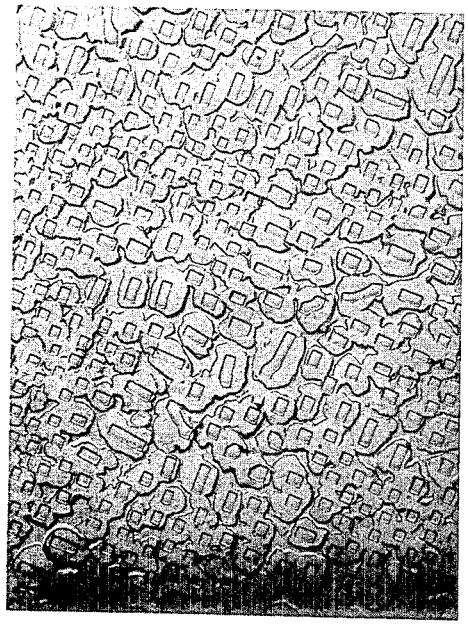
FIGS. 2a, 2b, and 2c show transverse photomicrographs of the directionally solidified alloy of the present invention with varying chromium levels.
Figure 2B:
Figure 2C:
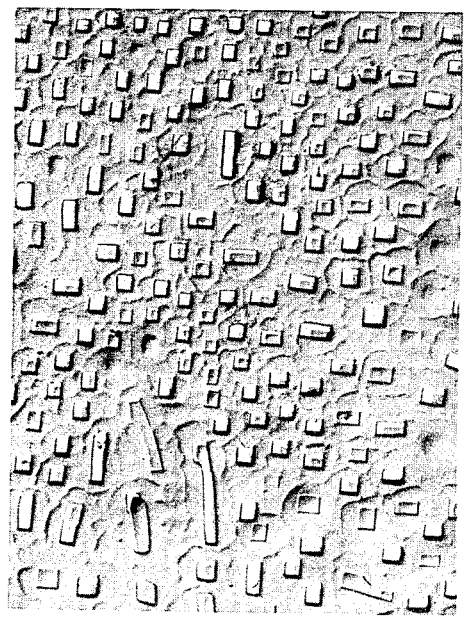
Figure 2D:
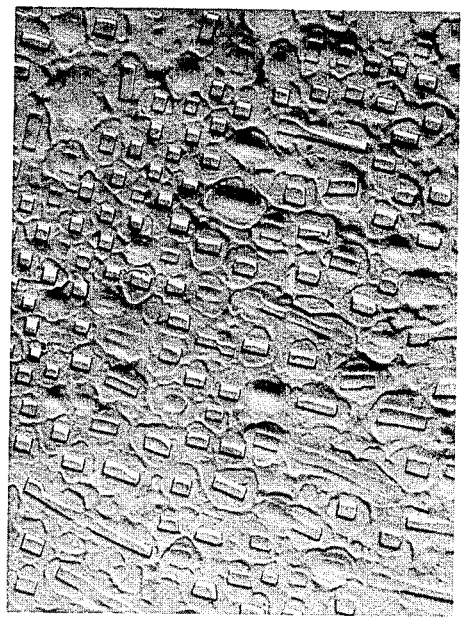

The present invention concerns a nickel-molybdenum-aluminum alloy of specific eutectic composition. This alloy has exceptional elevated temperature properties and is suited for use at elevated temperatures. The alloy may be directionally solidified to produce blades and vanes for use in gas turbine engines.

The nominal composition of the eutectic alloy of the invention is 4.6% aluminum, 35.8% molybdenum, balance essentially nickel. A directionally solidified alloy article having eutectic composition will have a continuous gamma matrix containing aligned alpha molybdenum rods or plates. At the eutectic composition there will be approximately 20 volume percent of the aligned fibrous reinforcing phase. The matrix may also contain significant amounts of the gamma prime phase.

The composition of the present invention is based on a newly discovered eutectic reaction in the nickel-aluminum-molybdenum system, shown as the curving line segment O-Y on FIG. 1. Because of the curvature of line O-Y, the composition will be described and claimed with relation to the points a—b—c—d—e—f shown on FIG. 1, and the line segments which connect these points. The atomic and weight percent compositions of these points are given in Table I.

TABLE I

| Point | Weight % | | | Atomic % | | |
|---|---|---|---|---|---|---|
| | Ni | Mo | Al | Ni | Mo | Al |
| a | 53.9 | 45.0 | 1.1 | 64.3 | 32.8 | 2.9 |
| b | 60.4 | 33.0 | 7.0 | 63.0 | 21.1 | 15.9 |
| c | 59.6 | 39.3 | 1.1 | 69.3 | 28.0 | 2.7 |
| d | 65.0 | 28.0 | 7.0 | 66.8 | 17.6 | 15.6 |
| e | 62.6 | 34.1 | 3.3 | 69.0 | 23.0 | 8.0 |
| f | 56.4 | 40.3 | 3.3 | 64.0 | 28.0 | 8.0 |

Because the compositions were experimentally determined as weight percents, the line segments in FIG. 1, an atomic percent diagram, are slightly curved. The region defined by a—b—c—d is the broad range of the present invention, in which the directionally solidified microsture will consist of a ductile matrix including the gamma phase in continuous form containing a fibrous alpha molybdenum second phase. The region b—d—e—f is the preferred region in which the continuous gamma matrix will contain from 20 to 80 volume percent of the gamma prime phase. Most preferably, these compositions exclude boundary compositions.

FIG. 1 is a 1200° C. isothermal section of a portion of the nickel-molybdenum-aluminum phase diagram, and illustrates the basic phase relationships of the system. Superimposed on this are three eutectic lines (which are taken from the liquidus diagram). X-O is the line of the monovariant eutectic reaction, Liquid → gamma + gamma prime, Y-O is the line of the monovariant eutectic reaction, Liquid → gamma + alpha and Z-O is the line of the monovariat eutectic reaction, Liquid → gamma prime + alpha. Point O is the ternary eutectic eutectic where Liquid → gamma + gamma prime + alpha. This invention lies in the area on and adjacent to the line segment Y-O. When compositions on or near this line are directionally solidified, immediately after solidification, just below the solidus, the alloy comprises a gamma matrix which contains alpha molybdenum in fibrous form. As the solidified alloy is further cooled gamma prime particles may form by a solid state reaction.

On the line segment O—Z, the same effect is observed except that the matrix is gamma prime and the particles which form in cooling are gamma. Near point O, both gamma and gamma prime form in continuous form during solidification.

At point O, the alloy freezes congruently at the invariant ternary eutectic temperature, however as one moves along either Y-O or Z—O the freezing process occurs over a range of temperatures, and the range increases slightly with increasing distance from point O.

Another parameter which also varies with distance from point O is the temperature at which the gamma prime phase forms by solid state reaction from the matrix. For compositions far removed from point O, relatively low temperatures must be achieved before the gamma prime phase forms. Since the invention alloy will be most often used at elevated temperatures, the preferred composition is that which is relatively near to point O, namely that region bounded by points b—d—e—f, the compositions, of which are listed in Table I. Materials in this preferred range will have the three phases γ, γ', and α present at elevated temperatures where the desirable high temperature properties of the γ, γ' -α structure are most useful. Another benefit found in alloys within the preferred composition range is that the volume fraction of the second phase (gamma prime) may be varied as one moves from point O towards point Y along O-Y. The preferred range will contain from 20-80 volume percent of the gamma prime phase. For compositions removed from point O the gamma prime will form as particles, but near point O, all the phases, γ, γ', and α will be continuous. Furthermore, an increased volume of the α (mo) phase will form in region a—c—e—f, as compared with the broad range a—b—c—d and this may be important for some applications.

The present invention also contemplates the modification of the alloy by the addition of one or more elements listed in Table II. Replacement of the basic constituents of the alloy, nickel, aluminum, and molybdenum by these elements up to the limits specified will not significantly interfere with the phase relationships of the alloy, but may make coupled growth during solidification more difficult to achieve. Coupled growth refers to a solidification process in which the matrix and the fibrous phase form simultaneously during solidification and where the fibrous phase is aligned and continuous over long distances. As used in this application, the term aligned refers to that situation where a majority of the fibrous second phase lies within about 20° of a common axis. The limits in Table I are the atomic percent of the basic constituents which may be replaced by the element specified, i.e. in an alloy containing 64 atomic percent nickel up to 24 atomic percent of the nickel may be replaced by an equal atomic amount of cobalt etc. Accordingly the limits set forth in Table I must be further limited by the provision that additions be limited to those which will still permit coupled growth and the formation of an aligned alpha second phase during directional solidification. Further, although these elements may generally be used up to the limits specified, when multiple elements are added to the base, such additions must be limited in elements and amounts so that extra phases are prevented from forming from the melt and coupled growth is achieveable. The elements Ta, Cb, Re and W show particular promise as alloying elements to improve mechanical properties.

TABLE II

| | % of Replacement Element Allowed on an Atomic Basis |
|---|---|
| a. Nickel Replacement Elements | |
| Co | ⎫ 40 Total |
| Fe | ⎬ |
| C | ⎭ <.1 |
| b. Nickel and Molybdenum Replacement Elements | |
| *Ta | ⎫ 15 Total |
| Cr | ⎬ |
| *Cb | ⎬ |
| *Re | ⎬ |
| *W | ⎭ |
| c. Nickel, Molybdenum, and | |

TABLE II-continued

Aluminum Replacement Elements
V
Hf     }  5
Ti     }  10 Total
Zr

The present invention will be made more clear through reference to the following illustrative examples.

EXAMPLE I

Alloys within the broad composition range were prepared, and the compositions are set forth in Table III. These alloys were directionally solidified at rates of about 3 cm./hr. and in thermal gradients of about 300° C C./cm. All the alloys shown in the Table displayed the desired continuous gamma/gamma prime matrix containing about 20 volume percent of continuous aligned alpha molybdenum fibers.

A series of alloys having a nominal 6.2% aluminum content were prepared and directionally solidified. The compositions contained (nominally) 6.2% Al, 31% Mo, 62.8% Ni + Cr. FIGS. 2a, 2b, 2c and 2d are transverse micrographs of samples which contained 0% Cr, 2% Cr, 4% Cr and 6% Cr respectively and it can be seen that even an addition of up to 6% Cr does not affect the coupled growth process. Chromium is commonly added to nickel base superalloys for improved oxidation resistance and preliminary tests indicate the Cr improves the oxidation behavior of the present alloy.

TABLE III

| Ni | Mo | Al | Quaternary Addition | Quinary Addition |
|---|---|---|---|---|
| Bal | 31 | 7.0 | | |
| Bal | 31.5 | 6.2 | | |
| Bal | 32.5 | 5.4 | | |
| Bal | 31 | 6.2 | 2 Cr | |
| Bal | 31.5 | 6.2 | 4 Cr | |
| Bal | 29 | 6.2 | 6 Cr | |
| Bal | 30 | 6.2 | 3 Re | |
| Bal | 29 | 6.1 | 5.9 Cr | 2.95 W |
| Bal | 34.6 | 4.7 | | |
| Bal | 36.8 | 3.7 | | |
| Bal | 29 | 6.2 | 9 Cr | |
| Bal | 35 | 5.5 | 3 Re | |
| Bal | 26 | 6.2 | 3 Re | |
| Bal | 42.3 | 1.1 | | |
| Bal | 32 | 5.0 | | |
| Bal | 39.7 | 2.5 | | |
| Bal | 33.5 | 5.5 | 1.5 Ti | |
| Bal | 33.5 | 5.5 | 5 Co | |
| Bal | 33.5 | 5.5 | 1.5 Hf | |
| Bal | 33.0 | 5.5 | 4.0 Ta | |

EXAMPLE II

Stress rupture tests were run on several of the alloys of the present invention. The compositions of these alloys, the test conditions and the rupture lives are shown in Table IV.

EXAMPLE III

Figure 3:
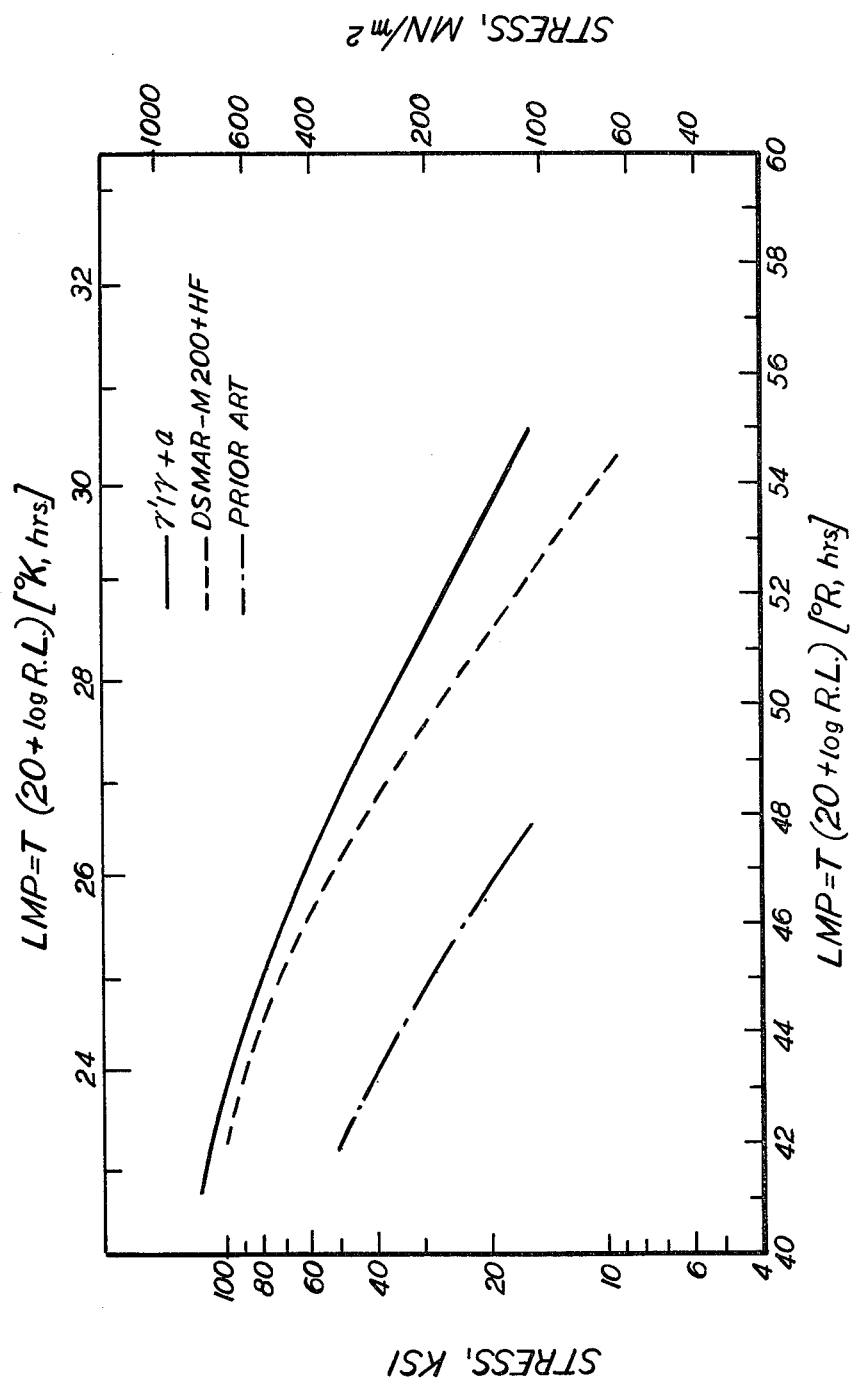
FIG. 3 shows a Larson-Miller parameter — Stress Rupture curve for the alloy of the present invention.

Stress rupture tests were run on a wide variety of alloys falling within the broad range of the present invention. Within the range of the invention, properties were found to be remarkably independent of composition. The results are shown in FIG. 3 where the stress to cause rupture is plotted versus the Larson-Miller parameter. Also shown in the figure is a curve for alloy MAR-M200 (directionally solidified), a "state of the art" nickel base superalloy which is currently in wide use in gas turbine engines, and a curve drawn from data presented in U.S. Pat. No. 2,542,962, labeled "Prior art". The alloys of the present invention appear to be superior to both the conventional nickel base superalloy and the invention of the Kinsey patent, U.S. Pat. No. 2,542,962. The present invention may be compared with the prior art in the following fashion: selecting conditions of 20 ksi load, one gets Larson-Miller parameter values of 46.5, 51.3, and 53.4 from the curve in FIG. 3, for the Kinsey alloy, alloy MAR-M200, and the present invention respectively. If one then assumes a test temperature of 1800° F, one gets rupture lives of 3.7, 501 and 4250 hours for the Kinsey alloy, alloy MAR-M200 and the present alloy respectively. Thus the present alloy is seen to be significantly superior to the prior art.

The present alloy is especially suited for the fabrication of gas turbine engine components such as blades and vanes.

Although the invention has been shown and described with respect to a preferred embodiment thereof, it should understood by those skilled in the art that various changes and omissions in the form and detail thereof may be made therein without departing from the spirit and the scope of the invention.

Having thus described a typical embodiment of my invention, that which I claim as new and desire to secure by Letters Patent of the United States is:

1. A directionally solidified article suited for use at elevated temperatures, having a structure consisting of a ductile matrix which contains the gamma phase (nickel solid solution) in continuous form, and an aligned fibrous alpha (molybdenum solid solution) ductile reinforcing phase, said region being defined by the points a—b—c—d shown in FIG. 1.

2. An article as in claim 1 in which the ductile matrix also contains from about 20 to about 80 volume percent of the gamma prime ($Ni_3Al$) phase, said composition being defined by the points b—d—e—f in FIG. 1.

3. An article as in claim 1 wherein up to about 40 atomic percent of the nickel has been replaced by an equal atomic amount of an element chosen from the group consisting of Co and Fe and mixtures thereof.

4. An article as in claim 1 wherein up to about 0.1 atomic percent of the nickel has been replaced by an equal amount of carbon.

TABLE IV

| Alloy Composition | | | | Test Conditions | | Rupture Life | | |
|---|---|---|---|---|---|---|---|---|
| Ni | Mo% | Al% | Cr% | Stress ksi | Temps. ° F | Hours | Elongation % | R.A. % |
| Bal | 31.5 | 6.2 | | 135 | 1400 | 74.4 | 26.2 | 32.2 |
| Bal | 31.5 | 6.2 | | 30 | 1900 | 92.9 | 29.8 | 55.9 |
| Bal | 31.5 | 6.2 | 1 | 125 | 1400 | 53.5 | 23.6 | 50.5 |
| Bal | 31.5 | 6.2 | 1 | 45 | 1800 | 41.0 | 40.8 | 44.0 |
| Bal | 31.5 | 6.2 | 1 | 30 | 1900 | 83.8 | 29.8 | 59.1 |
| Bal | 31.5 | 6.2 | 1 | 20 | 2000 | 139.4 | 20.4 | 64.5 |
| Bal | 31.5 | 6.2 | 3 | 25 | 1200 | 96.3 | 13.2 | 38.9 |

5. An article as in claim 1 wherein up to about 15 atomic percent of the sum of the nickel and molybdenum has been replaced by an equal atomic amount of an element chosen from the group consisting of Cr, Re, Ta, Cb and W and mixtures thereof.

6. An article as in claim 1 wherein up to about 10 atomic percent of the sum of the nickel, molybdenum and aluminum has been replaced by an equal atomic amount of an element chosen from the group consisting of Ti, Hf and Zr and mixtures thereof.

7. An article as in claim 1 wherein up to about 5 atomic percent of the sum of the nickel, molybdenum, and aluminum has been replaced by an equal atomic amount of vanadium.

* * * * *